United States Patent [19]
Nakasha et al.

[11] Patent Number: 5,390,145
[45] Date of Patent: Feb. 14, 1995

[54] RESONANCE TUNNEL DIODE MEMORY

[75] Inventors: Yasuhiro Nakasha; Yuu Watanabe, both of Kawasaki, Japan

[73] Assignee: Fujitsu Limited, Kawasaki, Japan

[21] Appl. No.: 166,108

[22] Filed: Dec. 14, 1993

[30] Foreign Application Priority Data

Apr. 15, 1993 [JP] Japan .................................. 5-088777

[51] Int. Cl.[6] ............................................. G11C 13/00
[52] U.S. Cl. ...................................... 365/159; 365/175
[58] Field of Search ..................... 365/159, 105, 175

*Primary Examiner*—Terrell W. Fears
*Attorney, Agent, or Firm*—Staas & Halsey

[57] ABSTRACT

A semiconductor memory device including a plurality of bit lines and a plurality of word lines which intersect to form a matrix of cross points. A respective memory cell is disposed at each cross point and corresponds to the respective word line and respective bit line intersecting at the respective cross point. Each memory cell includes a transfer gate having a first current terminal connected to the corresponding bit line and a control terminal connected to the corresponding word line. Each memory cell also includes a pair of serially connected negative differential resistance memory elements having an interconnection node therebetween. The interconnection node is connected to the second current terminal of the transfer gate. A characteristic controlling circuit is coupled to the plurality of bit lines and controls the voltage of each bit line based on whether a respective memory cell corresponding to the respective bit line is selected or not selected, the characteristic controlling circuit including a plurality of negative differential resistance elements respectively corresponding to the plurality of bit lines.

20 Claims, 14 Drawing Sheets

RESONANCE TUNNEL DIODE MEMORY

BACKGROUND OF THE INVENTION a) Field of the Invention

The present invention relates to a memory device, and more particularly to a memory device operating as static random access memories.

b) Description of the Related Art

An SRAM memory cell has two stable points and maintains the same state at each stable point while power is supplied to the cell.

An SRAM cell using metal oxide semiconductor (MOS) transistors includes basically two driver transistors and two loads. Each load is made of a MOS transistor or resistor.

Two sets of serial circuits each having a driver transistor and a load are connected in parallel. An interconnection node of each serial circuit is connected to the gate of the driver transistor of the other serial circuit. This circuit, like a flip-flop, takes two stable states by turning on one driver transistor and turning off the other driver transistor.

There has been a strong demand for increasing the memory capacity of SRAM devices as well as other semiconductor integrated circuits. The memory capacity can be increased by raising the integration degree of MOS transistors constituting memory cells through miniaturization thereof or through other means. However, increasing the capacity of a memory constituted by SRAM cells of the type using four driver transistors is limited more than dynamic random access memory (DRAM) cells each using one transistor and one capacitor.

A memory cell using a negative differential resistance element has drawn much attention as a memory structure able to form an SRAM with a more simplified structure. If an appropriate load is serially connected to a negative differential resistance element, three stable operating points can be obtained. Of the three stable operating points, an SRAM cell can be realized by using two outermost stable points.

As a negative differential resistance element, there is known an Esaki diode which uses the tunneling phenomenon at a high impurity concentration $p^+n^+$ junction. Recently, a resonance tunnel diode (RTD) having a quantum well structure has been developed in which a semiconductor layer (quantum well layer) such as GaAs having a relatively narrow band gap is sandwiched between semiconductor layers (potential barrier layers) such as GaAlAs having a relatively wide band gap.

As the thickness of the quantum well layer between the potential barrier layers is made small, the band is transformed into levels because of one-dimensional quantization. If the energy of externally supplied charge carriers matches one of the levels, current flows, and if the energy mismatches the level, the current reduces. If the energy of charge carriers again matches the next level, the current increases again.

FIG. 12 shows an SRAM memory circuit using RTDs according to a conventional technique. A plurality of word lines WL are arranged in the horizontal direction as viewed in FIG. 12, whereas a plurality of bit lines BL are arranged the vertical direction, to form a matrix configuration.

A memory cell 10 is connected at each cross point of the matrix. Each memory cell 10 has a driver diode DR, a load diode LD, and a transfer gate TG.

The driver diode DR and load diode LD are each formed by a resonance tunnel diode (RTD), and serially connected between a power supply voltage $V_{dd}$ and a ground potential (GND).

The transfer gate TG is formed, for example, by a high electron mobility transistor (HEMT) whose pair of current terminals are connected between a bit line BL and an interconnection node between the driver diode DR and load diode LD, and whose control terminal is connected to the word line WL.

Each word line WL is driven by an X selector 2. Each bit line BL is connected to a column sense circuit (CS) 5, and via a transfer gate M to a data input circuit 4. The gate of the transfer gate M is driven by an output of an AND gate (AND).

Two inputs of the AND gate are supplied to a write controller 3 and a Y selector 6. An output of the Y selector 6 is also supplied to the column sense circuit 5. An output of each column sense circuit 5 is supplied via a common data line DL to a main sense (MS) circuit 7.

In writing data to a memory cell, an AND gate is selected by the write controller 3 and Y selector 6 to turn on a particular transfer gate M and supply data to the corresponding bit line BL from the data input circuit 4.

The X selector 2 selects a particular word line WL to turn on the transfer gate TG connected to the selected word line WL. In this manner, the data is written to the memory cell 10 connected to the bit line BL to which the data was supplied and to the word line WL selected by a select signal.

In reading data, a particular memory cell 10 is selected by the X selector 2 and Y selector 6. Data read from the selected memory cell 10 via the turned-on transfer gate is transferred via the bit line BL to the column sense circuit 5 and sensed by the main sense circuit 7.

One end of each bit line BL opposite to the transfer gate M is connected to a pull-up resistor R which is connected to the power supply voltage $V_{dd}$. An RTD can realize a memory cell of a low power consumption operating at a low power, but has a small capability of charging/discharging the bit line during the data read. The pull-up resistor R has a function of increasing the current supply ability when a memory cell is selected.

FIG. 13 illustrates the fundamental characteristics of the memory circuit shown in FIG. 12. The abscissa represents a voltage V in units of volt, and the ordinate represents a current I in units of $\mu A$. A curve "a" indicates the characteristic of a driver diode DR. A curve "b" indicates a load characteristic of a load diode LD. A curve "c" indicates a load characteristic of a pull-up resistor R relative to the driver diode DR when the transfer gate DR turns on.

When a transfer gate TG turns on and a memory cell is selected, both the load diode LD and pull-up resistor R serve as the load of the driver diode DR. A curve "d" indicates the total load characteristic of the characteristics c and "b" of the pull-up resistor R and load diode LD.

The negative differential resistance characteristics shown in FIG. 13 are approximated by broken lines as shown in FIG. 14. Reference symbols for broken lines in FIG. 14 correspond to those shown in FIG. 13.

Under the condition that any memory cell is not selected, each driver diode DR is connected only to its load diode LD. Under this condition, the load characteristic of the driver diode DR is represented by the load characteristic b of the load diode so that intersecting points $A_0$ and $B_0$ become the stable operating points of the memory cell.

When a transfer gate TG turns on and a memory cell is selected, the load characteristic changes to the characteristic "d" and the stable points of the memory cell change to X and Y. Namely, in reading/writing data, the bit line BL is charged/discharged at the potential of X or Y.

As compared to the stable points $A_0$ and $B_0$ without the pull-up resistor, the current values with the pull-up resistor increase at the stable points X and Y. The shift of the high potential side stable points from $B_0$ to Y is less than that of the low potential side stable 2points from $A_0$ to X, so that the potential difference between "1" and "0" states becomes small.

The shift from the stable points $A_0$ and $B_0$ at the non-select state of a memory cell to the stable points X and Y at the select state of a memory cell is continuously and stably performed on the operating characteristic curve "a" of the driver diode. Similarly, when the memory cell select state transits to the memory cell non-select state, the stable points X and Y continuously and stably shift to the stable points $A_0$ and $B_0$ of the memory cell non-select state.

As described above, addition of a pull-up resistor to a bit line ensures the following advantages:

(1) providing stable high and low levels at the memory cell select state;

(2) suppressing the amplitude of a change in potential between the memory cell non-select state and select state, speeding up the operation;

(3) allowing current to flow as much as possible within a total power consumption limit, speeding up the operation; and (4) preventing the memory cell information from being destroyed when selecting a memory cell.

If a pull-up resistor is used as a bit line pull-up circuit in the memory circuit using negative differential resistor elements shown in FIG. 12, this pull-up resistor is required to be formed by a process different from the processes of forming other memory constituent elements.

A different process makes it difficult to precisely control the characteristics of a pull-up resistor. For example, the cases such as shown in FIGS. 15A and 15B may occur depending upon a change in process parameters.

In the case of FIG. 15A, the resistance value of a pull-up resistor is smaller than a designed value and the load characteristic "c" becomes so steep that the total load characteristic curve "d" intersects the operating characteristic curve "a" of the driver diode only at one point.

The peak of the driver diode characteristic curve "a" goes away from the valley of the load characteristic curve "d", caving only the stable point Y at the memory cell select-state. Therefore, the contents of the memory cell are destroyed.

In the case of FIG. 15B, the valley of the total load characteristic curve "d" of the load diode LD and pull-up resistor R contacts the peak of the operating characteristic curve "a" of the driver diode DR. Depending upon the process parameters, the load characteristic curve d contacts or does not contact the driver diode characteristic curve "a", making the characteristic of the memory cell unstable.

The amount of current at the low potential side stable point becomes greater than that at the high potential side stable points, by the effects of the total load characteristic. If the current amount at the high potential side, stable points is to be made high, it is necessary to make the slope of the total load characteristic curve steep. In this case, as shown in FIG. 15A, the load characteristic curve may depart from the driver diode characteristic curve.

SUMMARY OF THE INVENTION

It is an object of the present invention to provide an SRAM semiconductor memory device capable of lowering an operating current all the memory cell nonselect state and raising it at the memory cell select state.

It is another object of the present invention to provide an SRAM semiconductor memory device capable of facilitating a uniform adjustment of the driver element characteristics and load characteristics at the memory cell select state.

According to one aspect of the present invention, there is provided a semiconductor memory device having: a plurality of bit lines; a plurality of word lines intersecting the bit lines; a transfer gate having a first current terminal connected to the bit line, a control terminal connected to the word line, and a second current terminal, and a pair of negative differential resistance memory elements serially connected between the power supply wiring and the ground potential wiring, the interconnection node between the pair of negative differential resistance elements being connected to the second current terminal, the transfer gate and the pair negative differential resistance elements belong disposed at each cross point between the plurality of bit lines and the plurality of word lines; and a characteristic controlling circuit including a characteristic controlling negative differential resistance element connected to each bit line.

Preferably, the characteristic controlling circuit has the negative differential resistance element connected between the power supply wiring and each said bit line and the negative differential resistance element connected between each bit line and the ground potential wiring.

Because a characteristic controlling negative differential resistance element is connected to each bit line, the current value at the cell select state can be made great.

Use of the characteristic controlling negative differential resistance element allows the characteristics of the negative differential resistance memory elements to be easily controlled uniformly by a proper matching with the former element.

By connecting the negative differential resistance elements between the power supply wiring and each bit line and between each bit line and the ground potential wiring, the current values at the cell select state can be increased and well balanced both at the high and low potential stable points.

As described above, an SRAM semiconductor memory device of a simple structure can be realized in which a current supply capability can be greatly changed between the memory cell non-select state and select state.

It is possible to realize a sire,pie memory cell structure, and it is easy to obtain a high integration and high capacity of a memory device.

By reducing the operating current at the memory nonselect state, the total power consumption of the memory device can be reduced. Also in this case, a sufficient current supply capability can be ensured at the memory cell select state.

DETAILED DESCRIPTION OF THE PREFERRED EMBODIMENTS

Figure 1:
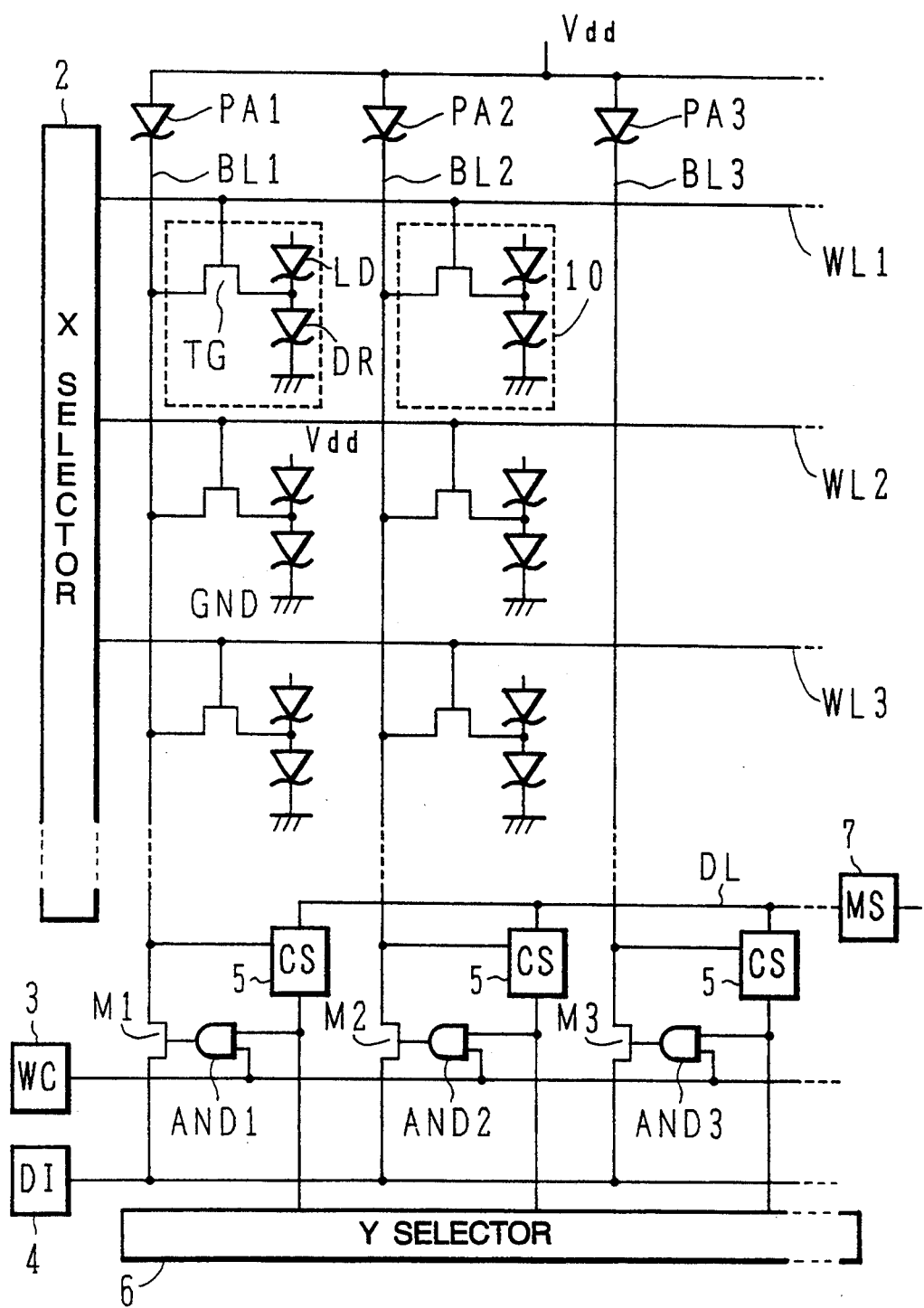
FIG. 1 is a circuit diagram of a semiconductor memory device according to an embodiment of the invention.

FIG. 1 is a circuit diagram of an SRAM semiconductor memory device according to an embodiment of the present invention.

A plurality of bit lines BL1, BL2, BL3, . . . are arranged in parallel, and a plurality of word lines WL1, WL2, WL3, . . . are arranged intersecting the bit lines. The bit Lines BL and word lines WL form a matrix configuration. A memory cell 10 is connected at each cross point of the matrix.

Each memory cell 10 has a driver diode DR made of a resonance tunnel diode RTD, and a load diode LD also made of an RTD and serially connected to the driver diode DR. The interconnection node between the driver diode DR and load diode LD is connected to one current terminal of a transfer gate TG made of a high electron mobility transistor HEMT.

The other current terminal of the transfer gate TG is connected to the bit line BL, and the gate terminal of TG is connected to the word line WL. A serial circuit of the load diode LD and driver diode DR is connected between a power supply voltage $V_{dd}$ and a ground potential (GND).

Each bit line BL is connected at one end to the power supply voltage $V_{dd}$ via a pull-up element PA made of RTD. At the other end shown at the lower area of FIG. 1, each bit line BL is connected to a column sense (CS) circuit 5 and also to a data input circuit 4 via a transfer gate M made of HEMT.

The gate of each transfer gate M is controlled by an output of an AND gate (AND). Two inputs of the AND gate are connected to a write controller 3 and a Y selector 6. The Y selector 6 is also connected to the column sense circuit 5.

Outputs of the column sense circuits 5 are connected via a common data line DL to a main sense (MS) circuit 7. A plurality of word lines WL are connected to an X selector 2, one of the word lines being selectively driven by the X selector 2.

One of memory cells 10 of the memory matrix is selected by the X and Y selectors 2 and 6.

In writing data to a memory cell, the write controller 3 and data input circuit 4 are also driven. When a signal from the write controller 3 and an output signal from the Y selector 6 are supplied, the AND gate delivers an output to turn on the corresponding transfer gate M. In response to this, data from the data input circuit 4 is supplied to the bit line BL via the turned-on transfer gate M.

The data rewrites the stable state of a bi-stable circuit constituted by a serial circuit of the driver diode DR and load diode LD, via the transfer gate TG turned on by an X select signal supplied to the word line WL.

In reading data, a particular memory cell 10 is selected by the X selector 2 and Y selector 6. Data read from the selected memory cell 10 via the transfer gate TG turned on by a select signal supplied from the X selector 2, is sensed by the column sense circuit 5 selected by the Y selector 6.

When the X selector 2 drives no word line WL, the transfer gates TG of all memory cells are off so that all the bit lines BL are connected, via the pull-up elements PA, only to the power supply voltage $V_{dd}$. No current will flow through the pull-up elements PA.

Figure 2A:
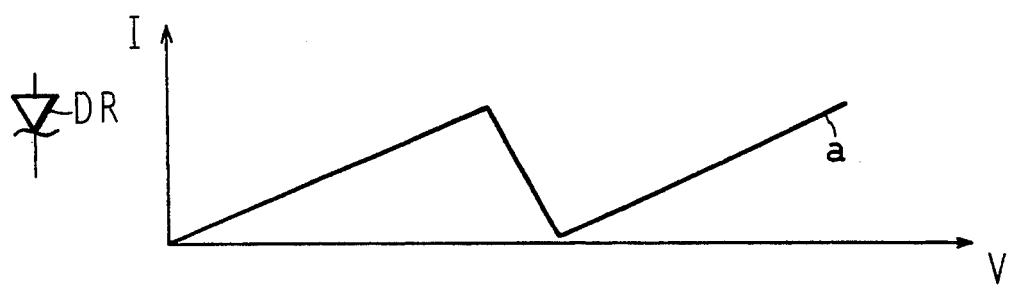
FIGS. 2A to 2C are graphs explaining the characteristics of the embodiment shown in FIG. 1.

The characteristics under the condition that a memory cell is in an isolated state will be described with reference to FIGS. 2A and 2B. FIG. 2A schematically illustrates the IV characteristic of a driver diode DR made of RTD. The abscissa represents a voltage V, and the ordinate represents a current I.

As indicated by the IV characteristic curve "a" of diode DR made of RTD, the current of RTD increases as the applied voltage increases, decreases after taking a local maximum at a peak voltage, and again increases after taking a local minimum at a valley voltage, giving a negative differential resistance characteristic.

Figure 2B:
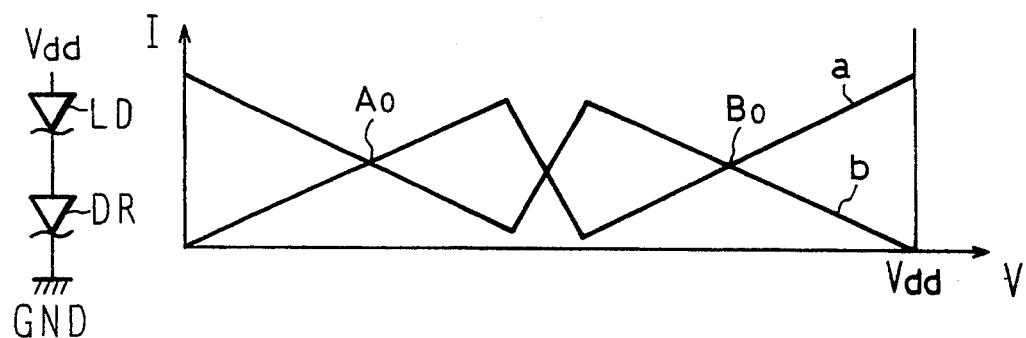

FIG. 2B illustrates the characteristics of a serial circuit of a driver diode DR and load diode LD both made of RTD. The abscissa represents a voltage V, and the ordinate represents a current I.

The serial circuit of the driver diode DR and Load diode LD is applied with the power supply voltage $V_{dd}$.

The characteristic curve "a" of the driver diode DR is the same as FIG. 2A.

The load diode LD is applied with a voltage of the power supply voltage $V_{dd}$ subtracted by a voltage applied to the driver diode DR. Therefore, the load characteristic curve "b" of the load diode LD is symmetrical to the curve a relative to $V_{dd}/2$.

The stable points of the serial circuit are $A_0$ and $B_0$ at the cross points between the drive diode DR characteristic curve "a" and load diode LD characteristic curve "b". Another cross point shown in FIG. 2B cannot be used as the operating point.

The memory cell constituted by the driver diode DR and load diode LD takes one of the stable points $A_0$ and $B_0$ while the transfer gate TG of the memory cell 10 is turned off.

Figure 2C:
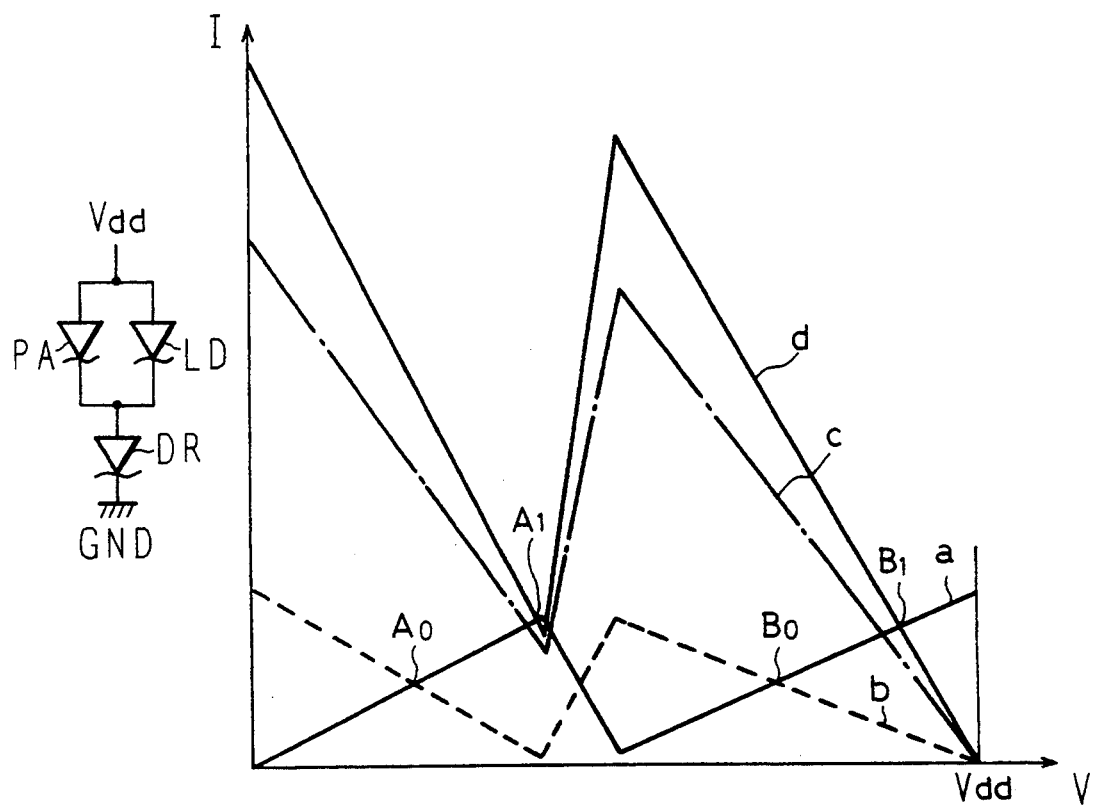

FIG. 2C schematically illustrates the characteristic curves explaining the operation of the selected memory cell 10.

When the memory cell 10 is selected and its transfer gate TG is turned on, a current supplied from the pull-up element PA also flows through the driver diode DR. As a result, the load characteristic curve for the driver diode DR is the total load characteristic of the load diode LD and pull-up element PA.

As shown in FIG. 2C, the curve "a" is the operating characteristic curve of the driver diode DR, the curve "b" is the load characteristic curve of the load diode LD, and the curve "c" is the load characteristic curve of the pull-up element PA.

The load characteristic curve for the driver diode DR is the total load characteristic curve of the load diode LD characteristic curve "b" and pull-up element PA characteristic curve "c". The curves "a" and "d" form three cross points of which the two extreme cross points $A_1$ and $B_1$ are used as the stable operating points.

When a memory cell 10 is selected, the stable points of the memory cell shift from $A_0$ and $B_0$ to $A_1$ and $B_1$. This shift is continuously performed on the characteristic curve "a" of the drive diode DR, providing a stable shift.

Figure 14:
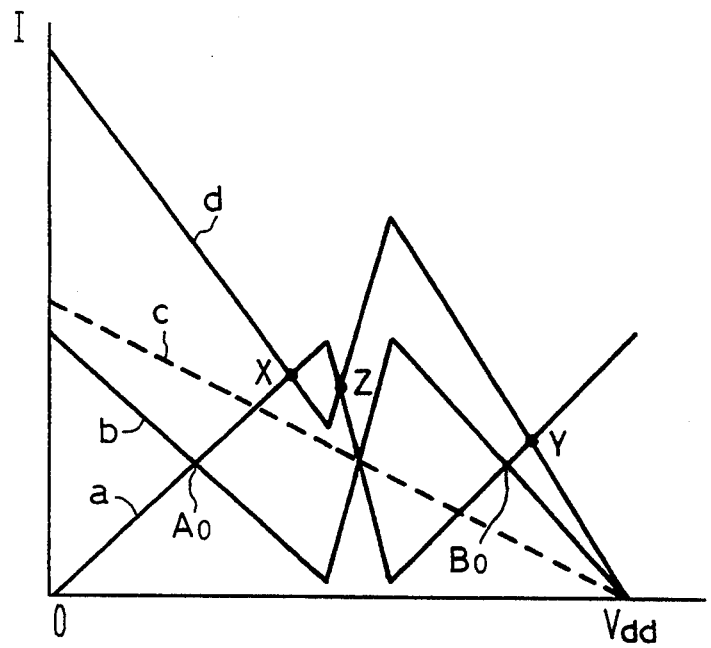
FIG. 14 is another graph illustrating the characteristics of the semiconductor memory device shown in FIG. 12.

If a resistor is used as the pull-up element, a stable point change is greater on the high voltage side than on the low voltage side, as explained with FIG. 14. In contrast, if a negative differential resistance element is used as the pull-up element, a stable point change can be made substantially uniform both on the high voltage and low voltage sides, as shown in FIG. 2C.

If the negative differential resistance element of the same type are used both for memory cells and pull-up elements, the same manufacturing processes can be used.

Figure 15A:
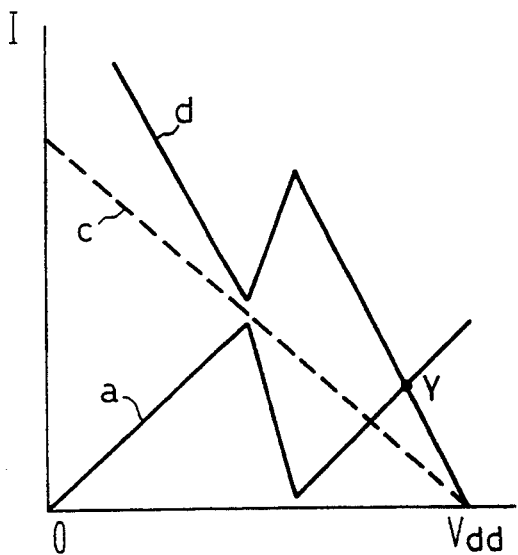
FIGS. 15A and 15B are graphs explaining the problems associated with the semiconductor memory device shown in FIG. 12.
Figure 15B:
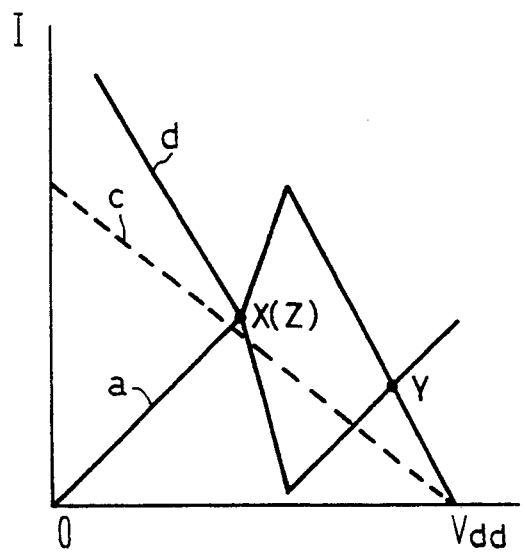

In this case, even if the process parameters change, this change is reflected to the same degree upon the negative differential resistance elements of both the memory cell and pull-up element, lowering the occurrence probability of such defects as explained with FIGS. 15A and 15B.

Figure 3A:
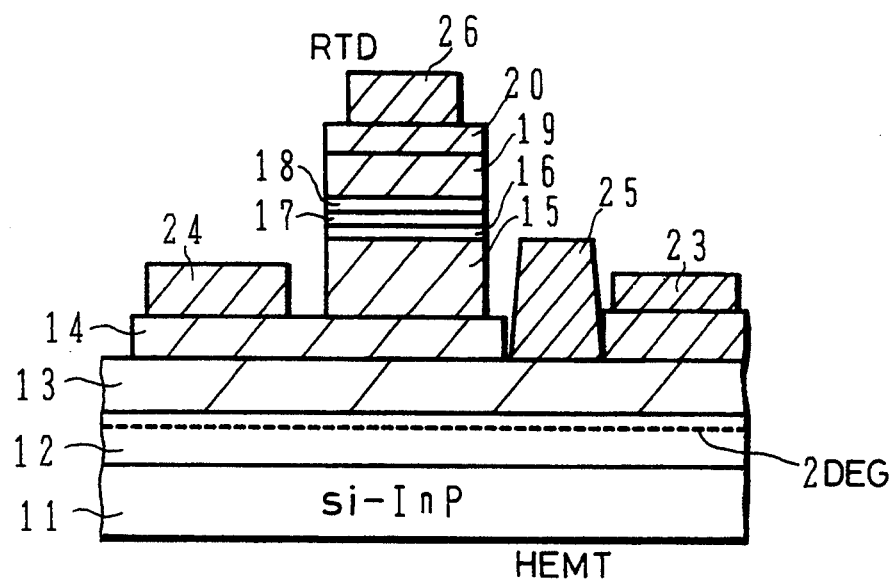
FIGS. 3A and 3B are a cross sectional view and a plan view showing an example of a memory cell usable by the embodiment shown in FIG. 1.
Figure 3B:
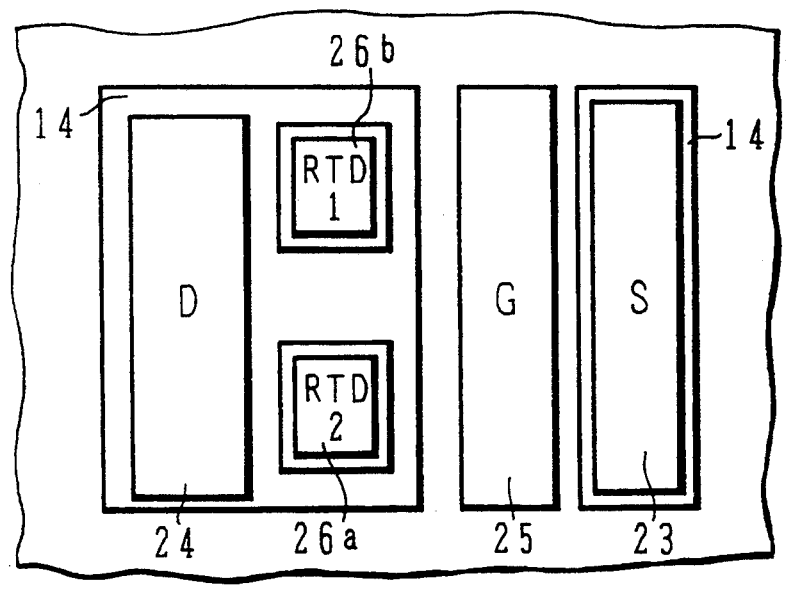

FIGS. 3A and 3B are schematic diagrams showing an example of the structure of a memory cell. As shown in FIG. 3A, on the surface of a semiinsulating InP substrate 11, a non-doped InGaAs electron transfer layer 12 is epitaxially grown and an n-type InAlAs electron supply layer 13 is epitaxially formed on the electron transfer layer 12.

Because of a difference between the InAlAs band structure and InGaAs band structure, a deep potential well is formed at the interface therebetween on the electron transfer layer 12 side, generating two-dimensional electron gasses 2DEG. A Schottky gate electrode 25 is formed on the electron supply layer 13, and a contact layer 14 made of n-type InGaAs is formed on both the sides of the gate electrode 25, the contact layer 15 being provided for a good ohmic contact with the electron supply layer 13.

Epitaxially grown and laminated on respective two partial areas of the surface of the contact layer 14 are a first electrode layer 15 made of n-type InGaAs, a first barrier layer 16 made of undoped InAlAs, a quantum well layer 17 made of undoped InGaAs, a second barrier layer 18 made of undoped InAlAs, a second electrode layer 19 made of n-type InGaAs, arid a contact layer 20 made of high impurity concentration InGaAs.

A source electrode 23 and a drain electrode 24 are formed on the contact layer 14, and an RTD electrode 26 is formed on the contact layer 20.

FIG. 3B is a plan view of the memory cell structure shown in FIG. 3A. Two RTDs 26 on two separated areas of the contact layer 14 are formed with electrodes 26a and 26b. The electron transfer layer 12, electron supply layer 13, and contact layer 14 form a HEMT.

The two RTDs 26 formed on the drain region of HEMT have symmetrical structures in the vertical direction so that they provide symmetrical characteristics with respect to the applied voltage. These two RTDs 26 therefore correspond to the driver diode and load diode connected to the drain of HEMT of the transfer gate TG shown in FIG. 1.

Namely, RTD1 and RTD2 correspond to the serially connected driver diode and load diode, and the drain electrode of HEMT is connected to the interconnection node between the drive diode and load diode. In this manner, the memory cell 10 is configured.

For example, the memory cell 10 has the following parameters. The size of RTD1 26b and RTD2 26a is of a 5 μm square, a peak current is 50 μA, a peak voltage is 0.4 V, a valley voltage is 0.55 V, and the ratio of a peak current to a valley current is "5".

For example, HEMT forming the memory cell transfer gate is an enhancement type HEMT having a gate length of 1 μm and a gate width of 10 μm. The corresponding RTD forming the pull-up element PA has a size of 10 μm square, a peak current of 175 μA, a peak voltage of 0.4 V, a valley voltage of 0.55 V, and the ratio "5" of a peak current to a valley current.

RTDs having the same peak voltage and valley voltage can be formed by the same processes. The current level can be changed by using different areas of RTDs. For example, HEMT forming the bit line transfer gate M has a gate length of 1 μm and a gate width of 50 μm.

Figure 4A:
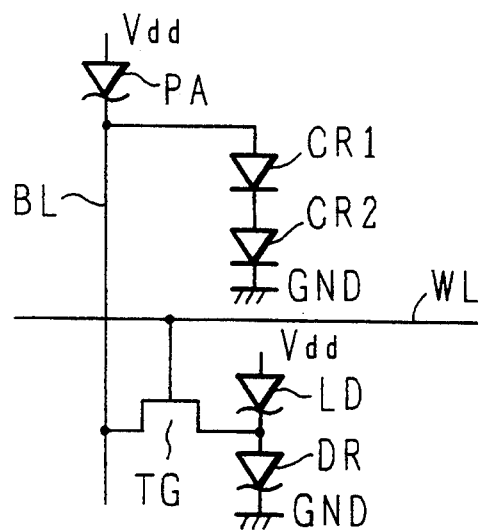
FIGS. 4A and 4B are a circuit diagram of a voltage clamping circuit used with the semiconductor memory device and a graph showing the characteristics of the device, according to another embodiment of the invention.
Figure 4B:
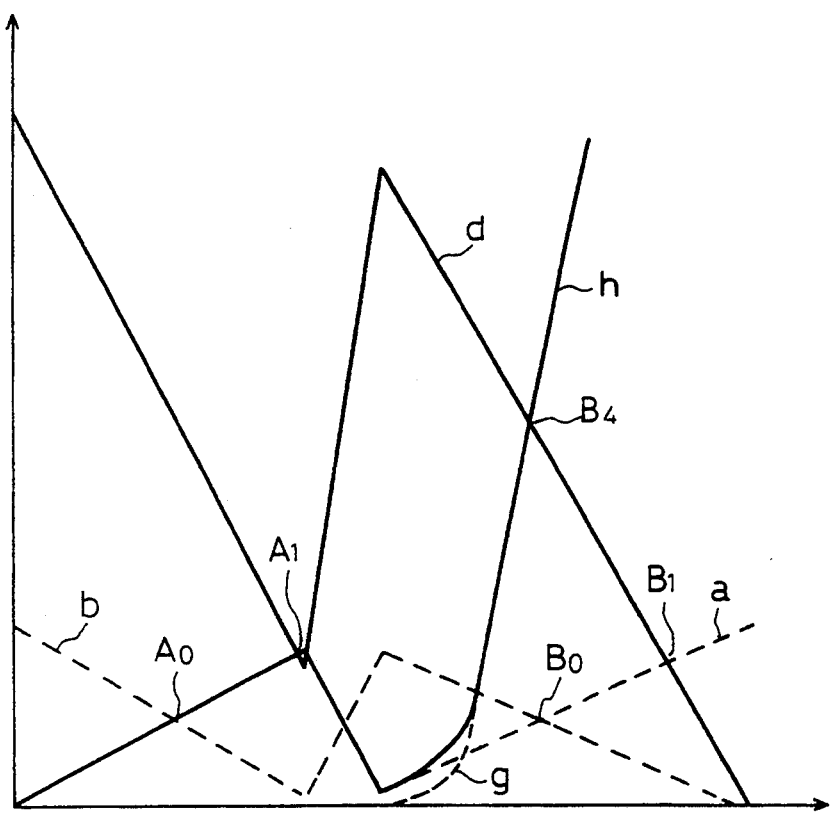

FIGS. 4A and 4B illustrate a memory cell with voltage clamping diodes connected to it. In FIG. 4A, a bit line BL is connected to the power supply voltage $V_{dd}$ via a pull-up element PA formed by RTD, and grounded via two serially connected diodes CR1 and CR2. The structures of the memory matrix and peripheral circuits are the same as the embodiment shown in FIG. 1.

In the embodiment shown in FIGS. 4A and 4B, a diode circuit is inserted between each bit line and the ground potential. Therefore, at a certain positive potential of the bit line, a current will flow through the diode circuit. When the memory cell is selected, the current flowing through the load diode LD flows through the driver diode DR and through the diode circuit CR.

FIG. 4B shows the characteristic curves explaining the operation of the memory circuit having the structure shown in FIG. 4A. The load characteristic curves "a" and "b" are the same as the embodiment shown in FIG. 1. The total load characteristic curve "d" when a memory cell is selected is also the same as the embodiment shown in FIG. 1.

When a memory cell is selected, the current flowing via the load diode LD to the interconnection node is distributed to the driver diode DR and diode circuit CR. As a result, the circuit portion on the ground potential side as viewed from the interconnection node has the characteristic curve "h" which is the total characteristic of the driver diode DR characteristic "a" and diode circuit CR characteristic "g".

When the potential at the interconnection node exceeds the threshold voltage of the diode circuit, a current abruptly flows through the diode circuit CD to clamp the potential at the interconnection node. As a result, in this embodiment, the high voltage side stable point B1 such as shown in FIG. 1 changes to a stable point B4 shown in FIG. 4B. With this diode voltage clamping circuit, the high voltage side stable point can be prevented from taking an excessively high potential when a memory cell is selected.

Figure 5:
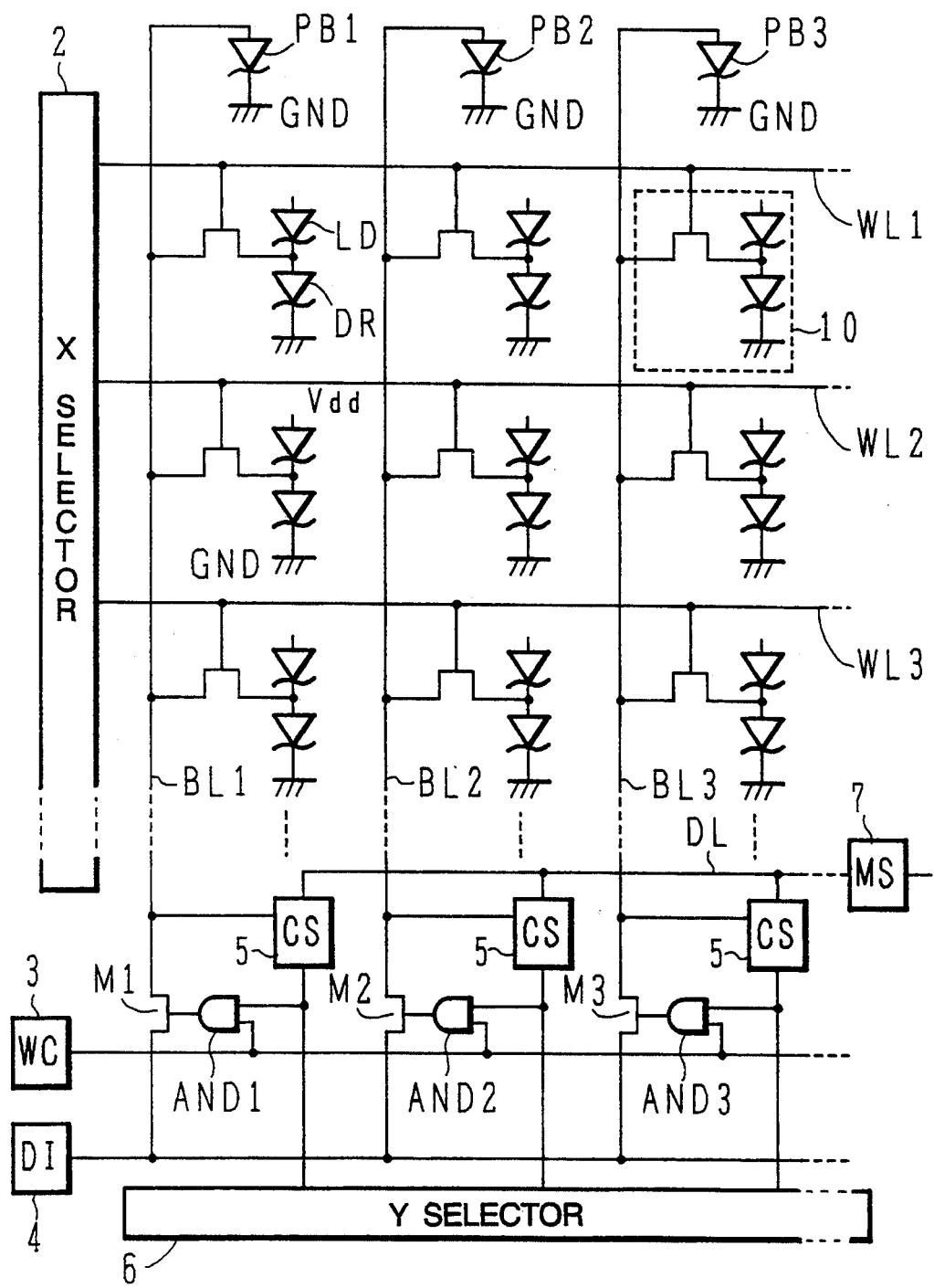
FIG. 5 is a circuit diagram of a semiconductor memory device according to another embodiment of the invention.

FIG. 5 is a circuit diagram of an SRAM type semiconductor memory device according to another embodiment of the invention. In this embodiment, as shown in the upper part of FIG. 5, a pull-up element PB made of RTD is connected between each bit line BL and the ground potential GND, and no pull-up element is connected between the bit line BL and the power supply voltage $V_{dd}$. The other structures are the same as the memory circuit shown in FIG. 1.

In this embodiment, under the condition a memory cell is selected, two RTDs, DR and PB are connected in parallel between the ground potential and the interconnection node of two RTDs.

Figure 6:
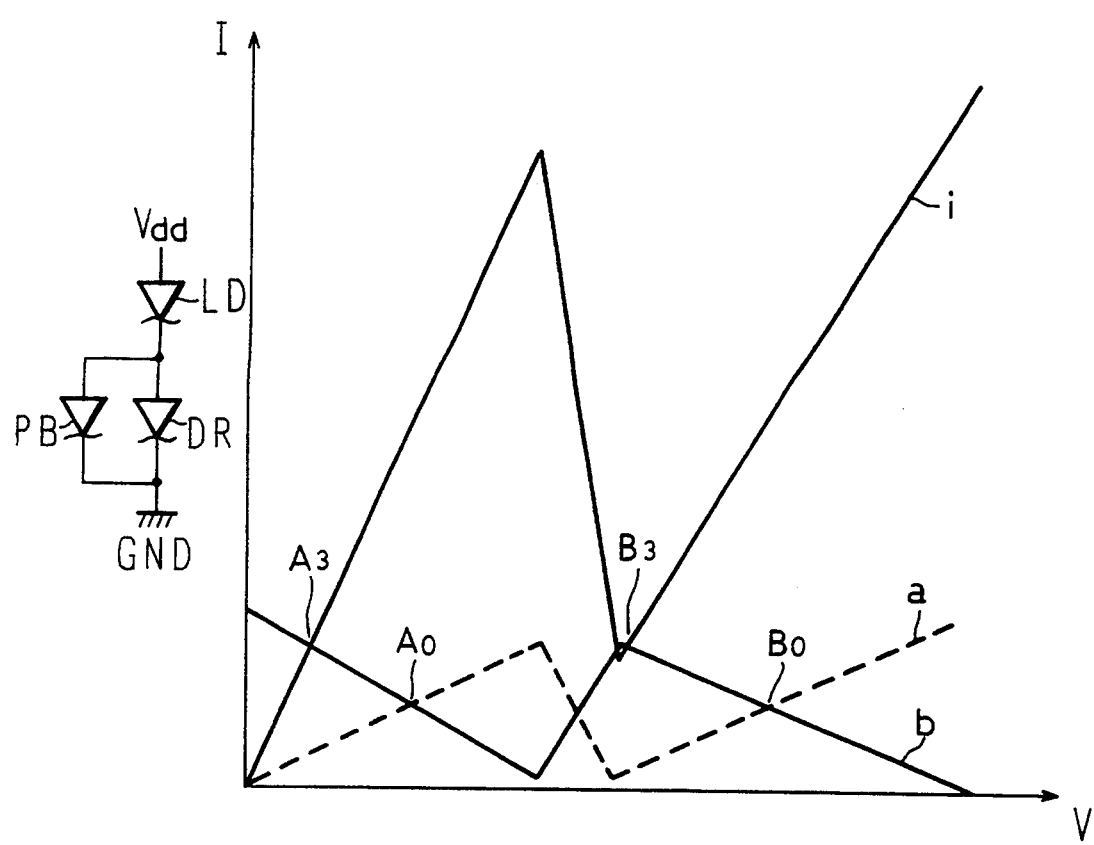
FIG. 6 is a graph explaining the characteristics of the embodiment shown in FIG. 5.

FIG. 6 is a graph schematically illustrating the characteristics of a memory cell shown in FIG. 5. The abscissa represents a voltage V and the ordinate represents a current I. The drive diode DR characteristic curve "a" and load diode LD characteristic curve "b" are the same as a embodiment shown in FIG. 1.

When a memory cell is selected, the drive diode DR is connected in parallel to the pull-up element PB, so that both the characteristics are added to provide the total characteristic curve "i". Namely, although the load characteristic does not change, the characteristic on the driver diode side changes. As a result, the stable points become $A_3$ and $B_3$ when a memory cell is selected. The current values increase and the potentials lower, as compared to the stable points $A_0$ and $B_0$ when a memory cell is not selected. The pull-up element PB and other elements can be manufactured in the manner like the pull-up element of the embodiment shown in FIG. 1.

The function of RTD for the element PB is a pull-down element from the context that it lowers the potentials at the stable points when a memory cell is selected, and is a pull-up element from the context that it increases the current amounts. In this specification, such an element inclusively called a pull-up element.

Figure 7:
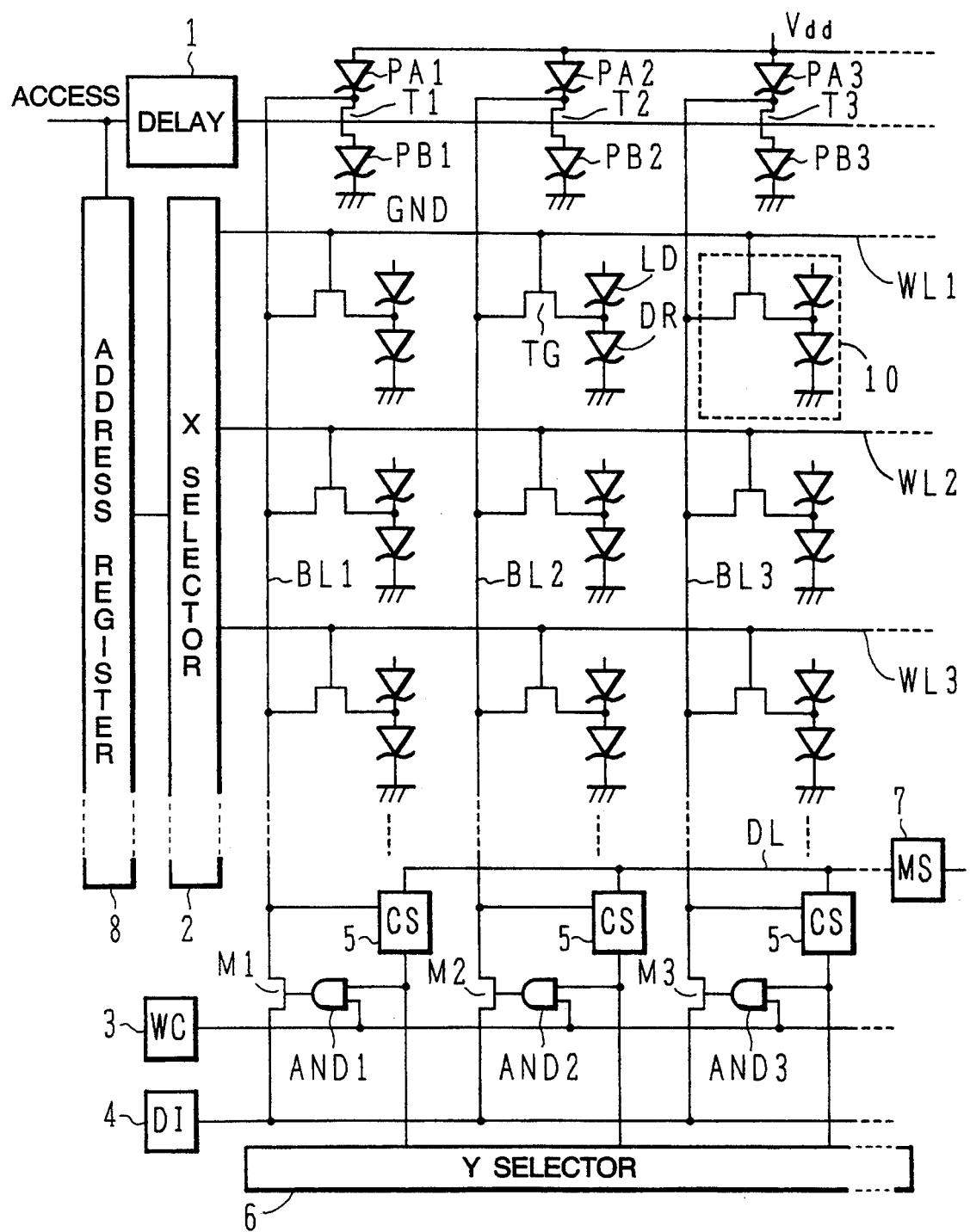
FIG. 7 is a circuit diagram of a semiconductor memory device according to another embodiment of the invention.

FIG. 7 is a circuit diagram of an SRAM type semiconductor memory device according to another embodiment of the invention. In this embodiment, a pull-up element PA like the embodiment shown in FIG. 1 is connected between each bit line BL and the power supply voltage $V_{dd}$, and another pull-up element PB like the embodiment shown in FIG. 5 and a transfer gate T serially connected to the pull-up element PB are connected between the bit line BL and the ground potential GND.

The gate electrode of the transfer gate T connected between the pull-up elements PA and PB is driven by an output from a delay circuit 1 which is supplied with an access signal. Address signals X0, X1, X2, . . . are supplied via an address register 8 to the X selector 2.

The transfer gate T connected between each bit line BL and each pull-up element PB shown in FIG. 7 may be connected between the bit line BL and other pull-up element PA. The other structures are the same as the embodiments shown in FIGS. 1 and 5.

Figure 8A:
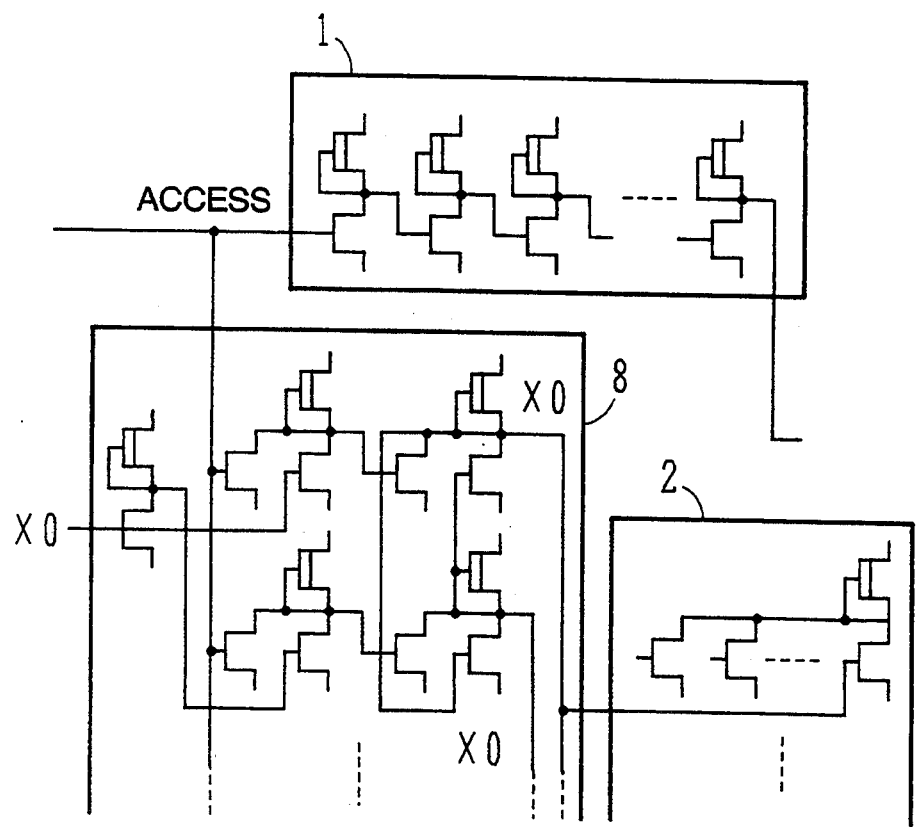
FIGS. 8A and 8B are a circuit diagram showing the detailed structured of the delay circuit, address register, and X selector of the embodiment shown in FIG. 7, and a timing chart.
Figure 8B:
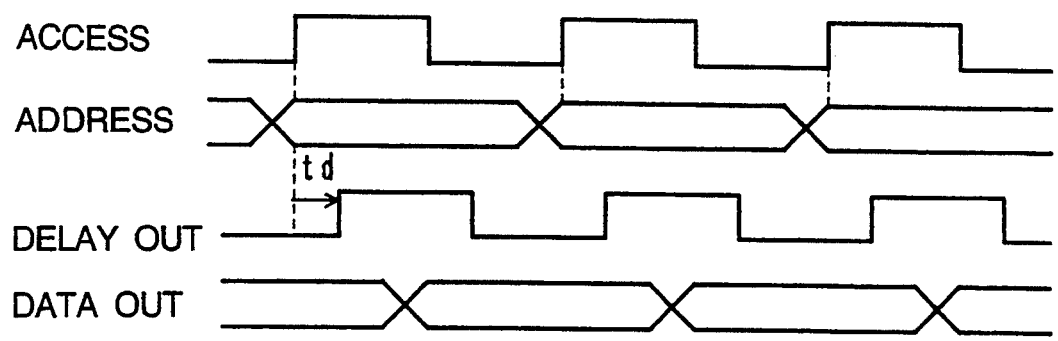

FIGS. 8A and 8B are a circuit diagram showing an example of the structure of the delay circuit 1, address register 8, and X selector, and a timing chart explaining the operation. In FIG. 8A, the delay circuit 1 is made of, for example, ten serially connected inverters.

A depletion (D) type FET and an enhancement (E) type FET are serially connected, and the gate electrode of D-FET is directly coupled to its source electrode to make it a load of E-FET. An input signal is applied to the gate electrode of E-FET. This serial circuit forms an inverter.

A serial connection of such two inverters forms one stage of a delay element. In this example, the delay circuit 1 of five stages is formed. An access signal is inputted to the delay circuit 1, the access signal taking a high level when accessing a memory cell and taking a low level when not accessing a memory cell.

Address signals X0, X1, . . . and the access signal are applied to the address register 8. As shown in FIG. 8B, the address signal is inputted before the access signal rises. When the access signal takes the high level, the address register is locked to invalidate the inputted address signal. A delay output is delivered after a delay time td from when the access signal is inputted. The delay time td is, for example, 200 psec.

A plurality of serial circuits each formed by D-FET and E-FET are connected between the power supply voltage $V_{dd}$ and ground potential GND. A serial connection of inverters is realized by applying an output potential of the preceding stage inverter to the gate of the next stage inverter.

In the memory circuit shown in FIG. 7, the transfer gate T of the pull-up circuit is driven by an Y select signal supplied from the Y selector, and the driving timing is delayed by the delayed access signal supplied from the delay circuit 1.

Accordingly, when a memory cell is selected, the transfer gate TG of the memory cell is first turned on to configure the circuit shown in FIG. 1 with the pull-up element PA. Next, the transfer gate T is turned on so that the pull-up element PB is also connected to the memory cell.

Figure 9:
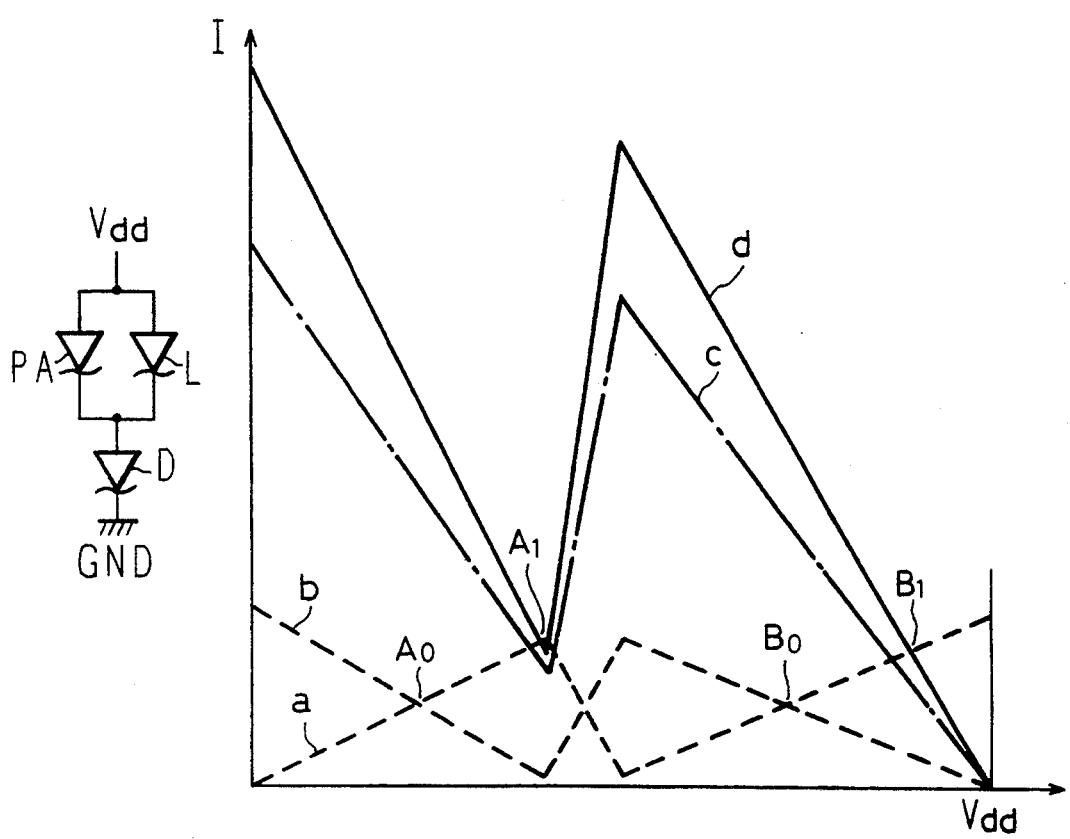
FIG. 9 is a graph explaining the characteristics of the embodiment shown in FIG. 8.

FIG. 9 is a graph schematically showing the characteristics of the memory device when a memory cell is selected and the transfer gate TG is turned on, but the transfer gate T is not still turned on. The characteristics shown in FIG. 9 are the same as the characteristics shown in FIG. 2C of the memory device shown in FIG. 1.

As the pull-up element PA made of RTD is connected in parallel with the load diode, the load characteristic curve changes from "b" to "d", and its stable operating points change from $A_0$ and $B_0$ to $A_1$ and $B_1$.

Next, when a drive signal is supplied from the delay circuit 1 to the transfer gate T, the transfer gate T is turned on and the pull-up element PB is connected between the bit line and the ground potential GND.

Figure 10:
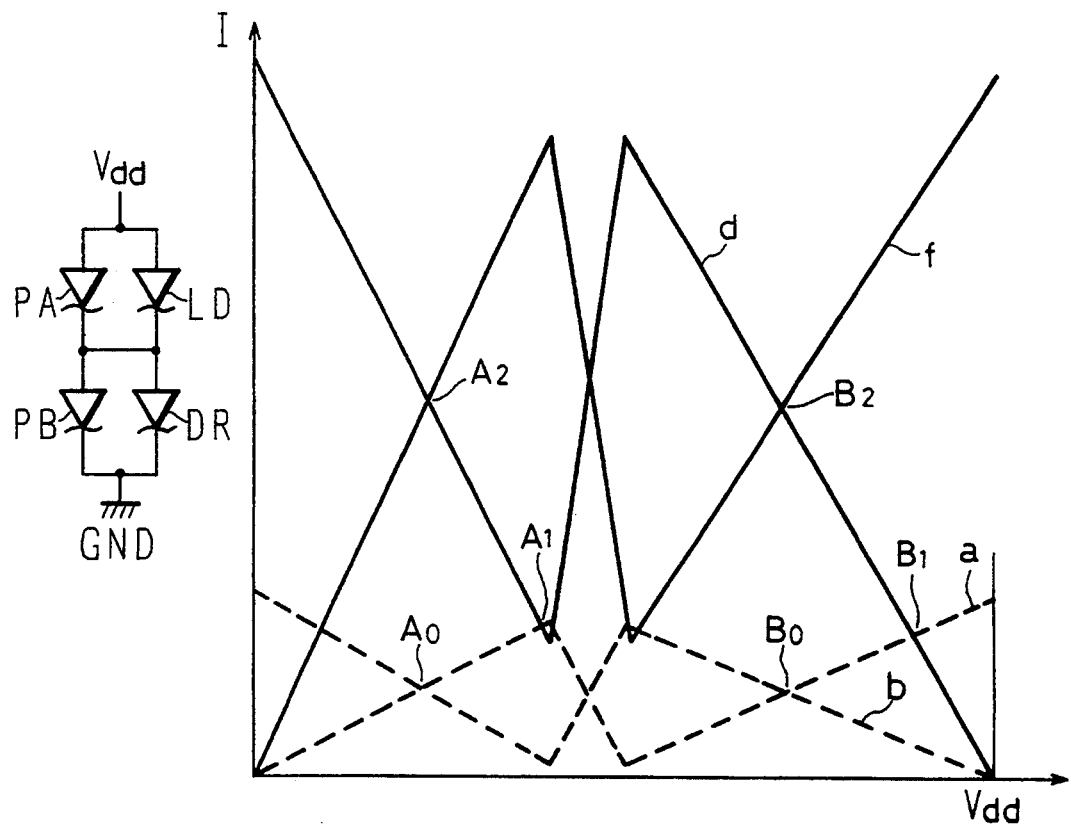
FIG. 10 is another graph explaining the characteristics of the embodiment shown in FIG. 8.

FIG. 10 is a graph schematically showing the characteristics of the memory device when the pull-up element PB is connected between the bit line and the ground potential GND. In contrast with the characteristic curves shown in FIG. 9, the characteristic curve a on the driver diode side changes from "a" to "f" when the pull-up element PB is connected.

If the pull-up elements PA and PB are made to have the same ratings, the characteristic curves "d" and "f" become symmetric. Because the characteristic curve on the driver diode side changes to f, the stable operating points change from $A_1$ and $B_1$ to $A_2$ and $B_2$.

If the driver diode DR and load diode LD are made of RTDs having the same ratings and if the pull-up elements PA and PB are made of RTDs having the same ratings, the peak voltages as well as the valley voltages of the characteristic curves a and f are substantially the same, and those of the characteristic curves "b" and "d" are also substantially the same.

If RTDs of the pull-up circuit or PA and PB are made to have a larger current level than RTDs of the memory cell or DR and LD, then the current level at the memory cell select state can be increased considerably.

Namely, in the case of the characteristic curves shown in FIG. 10, the current level can be increased in correspondence with the ratio of the peak current to the valley current of each negative differential resistance element. By properly setting the characteristic curves, the current levels at the stable points $A_0$ and $B_0$ at the memory cell non-select state can be made substantially the same as the current levels at the stable points $A_2$ and $B_2$ at the memory cell select state. In this manner, a memory cell having a good drive ability and good balance can be realized.

Figure 11:
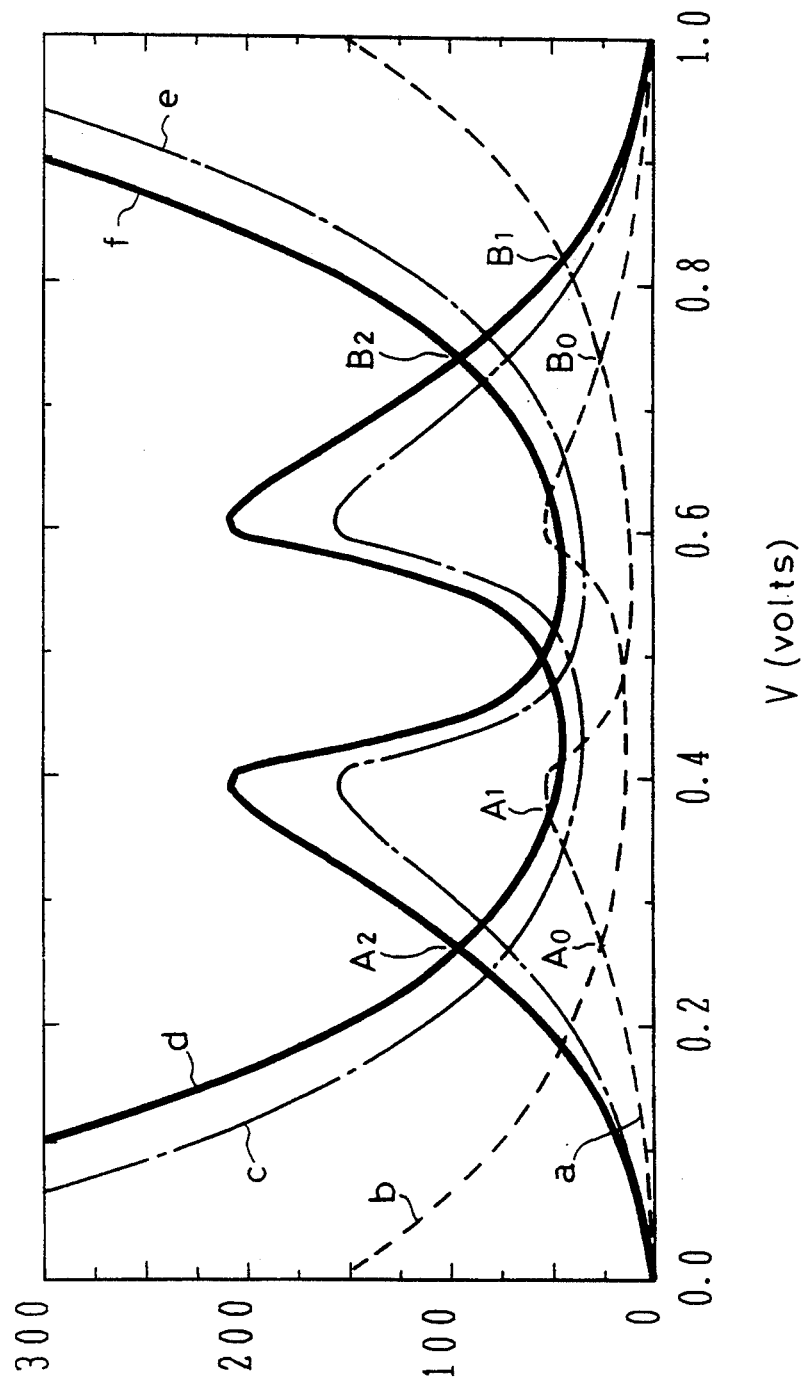
FIG. 11 is another graph explaining the characteristics of the embodiment shown in FIG. 8.
Figure 12:
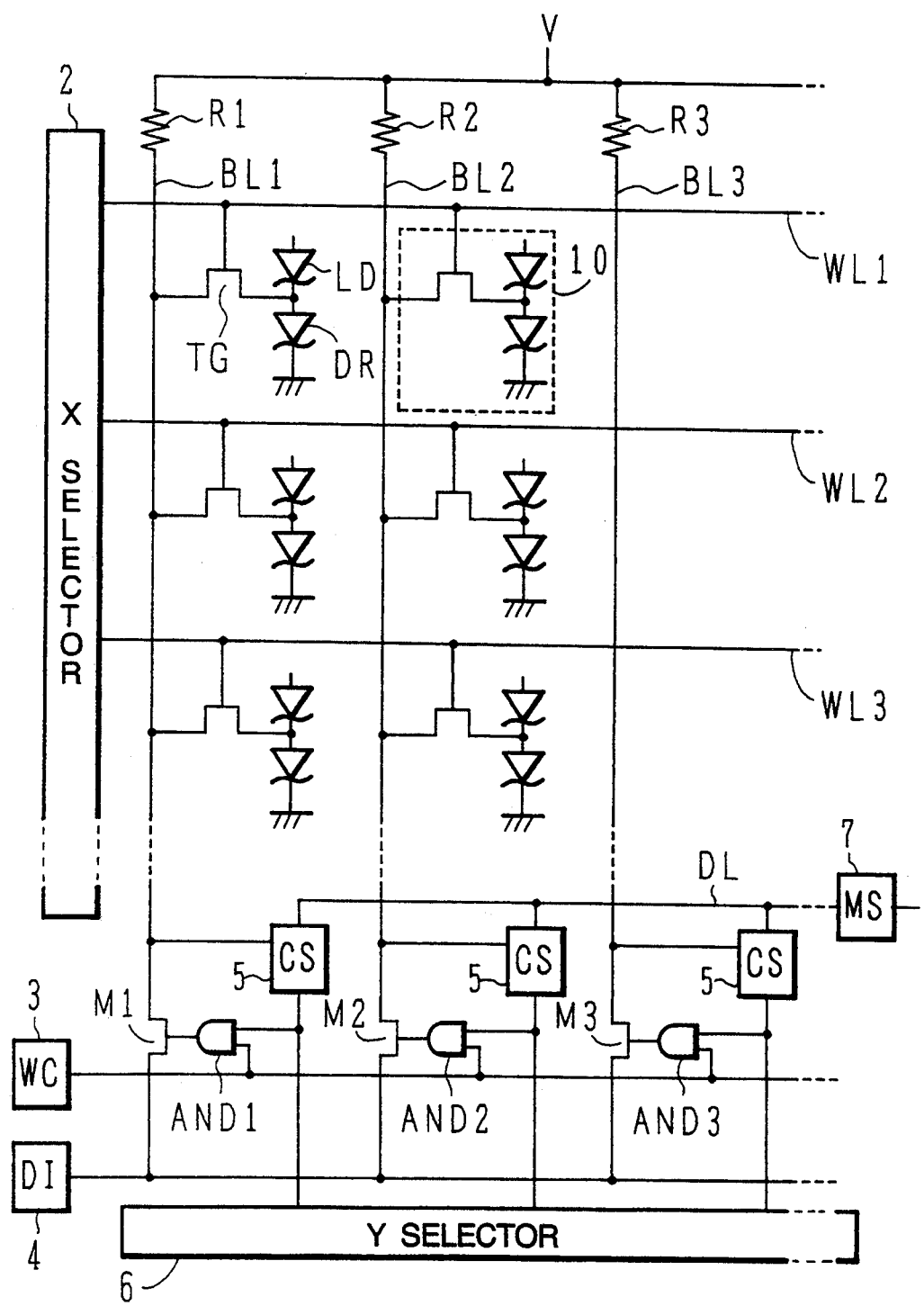
FIG. 12 is a circuit diagram of a conventional semiconductor memory device.
Figure 13:
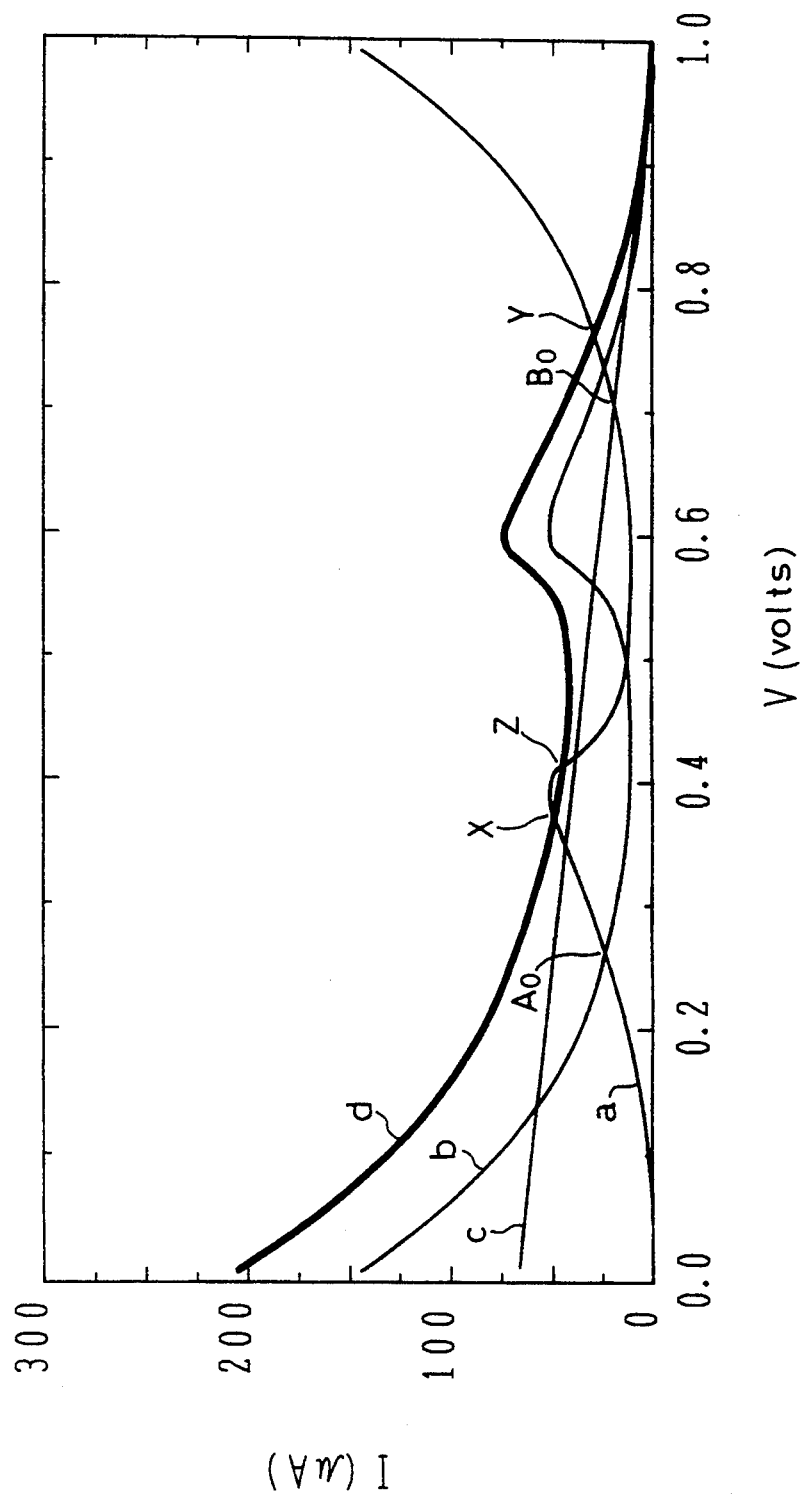
FIG. 13 is a graph illustrating the characteristics of the semiconductor memory device shown in FIG. 12.

FIG. 11 is a graph showing the more detailed characteristic curves shown in FIGS. 9 and 10. Reference symbols in FIG. 11 correspond to those used in FIGS. 9 and 10.

In the embodiments described above, RTDs of a memory cell and a pull-up circuit can be manufactured by the same processes so that the peak voltages and valley voltages can be made substantially the same. The current level can be determined depending upon the area of each RTD.

Furthermore, by using the structure shown in FIGS. 3A and 3B, HEMT and RTD can be formed on the same substrate by using compatible processes. The diode shown in FIGS. 4A and 4B can be formed between a gate electrode and a commonly connected source and drain electrode of HEMT.

Examples of the stable operating points of the characteristic curves shown in FIGS. 4A and 4B are as follows. When the transfer gate of a memory cell turns on, the stable operating points become 0.37 V and 0.82 V. When the transfer gate of the pull-up circuit turns on after the delay time of 100 ps by the delay circuit of five stages, the stable operating points become 0.26 V and 0.73 V.

In the above examples, the current flowing through the pull-up circuit is about 100 μm both at the low and high potential operating points, which is considerably larger than when the pull-up circuit is formed by a resistor.

In the above description, HEMT and RTD have been made of InGaAs and InAlAs. Other combinations of materials such as GaAs and AlGaAs may also be used for manufacturing similar circuits.

Instead of using group III-V compound materials, group IV semiconductor such as Si may be used in which a negative differential resistance element may be formed by an Esaki diode and a transfer gate may be formed by MOSFET. A diode may be formed by a single pn junction or may be formed by using a transistor structure.

The present invention has been described in connection with the above embodiments. The invention is not limited to only the above embodiments, but obviously various changes, improvements, combinations, and the like are possible by those skilled in the art.

We claim:

1. A semiconductor memory device comprising:
a plurality of bit lines;
a plurality of word lines which intersect the plurality of bit lines to form a matrix of cross points, each cross point corresponding to an intersection between a respective bit line and respective word line;
a plurality of memory cells, a respective memory cell disposed at each cross point and corresponding to the respective word line and respective bit line intersecting at the respective cross point, each memory cell being individually selectable in accordance with voltages on the corresponding bit line and the corresponding word line, each memory cell comprising:
a transfer gate having a first current terminal connected to the corresponding bit line, a control terminal connected to the corresponding word line, and a second current terminal, and
a pair of serially connected negative differential resistance memory elements having an interconnection node therebetween which is connected to the second current terminal of the transfer gate; and
a characteristic controlling circuit which is coupled to the plurality of bit lines and controls the voltage of each bit line based on whether a respective memory cell corresponding to the respective bit line is selected or not selected, the characteristic controlling circuit comprising a plurality of negative differential resistance elements respectively corresponding to, and connected to, the plurality of bit lines.

2. A semiconductor memory device according to claim 1, wherein each negative differential resistance element of the characteristic controlling circuit has a current level greater than a current level of the pair of negative differential resistance memory elements of the memory cell corresponding to the respective bit line that corresponds to the respective negative differential resistance element.

3. A semiconductor memory device according to claim 1, wherein the pair of negative differential resistance memory elements of each memory cell is a pair of resonance tunnel diodes.

4. A semiconductor memory device according to claim 1, wherein the transfer gate of each memory cell is a high electron mobility transistor.

5. A semiconductor memory device according to claim 3, wherein the transfer gate of each memory cell is a high electron mobility transistor and the pair of negative differential resistance elements of each memory cell is a pair of resonance tunnel diodes formed on one current terminal region of the high electron mobility transistor.

6. A semiconductor memory device according to claim 1, further comprising a power supply wiring and a ground wiring, the pair of negative differential resistance memory elements of each memory cell being connected between the power supply wiring and the ground wiring.

7. A semiconductor memory device according to claim 6, wherein each negative differential resistance element of the characteristic controlling circuit is connected between the power supply wiring and the respective bit line corresponding to the respective negative differential resistance element.

8. A semiconductor memory device according to claim 6, wherein each negative differential resistance element of the characteristic controlling circuit is connected between the respective bit line corresponding to the respective negative differential resistance element and the ground wiring.

9. A semiconductor memory device according to claim 6, wherein the characteristic controlling circuit comprises, for each bit line, a respective negative differential resistance element connected between the power supply wiring and the respective bit line and a respective negative differential resistance element connected between the respective bit line and the ground wiring.

10. A semiconductor memory device according to claim 9, further comprising:
a respective switching transistor for each bit line, each switching transistor having a control terminal and being connected between the respective bit line and one of the negative differential resistance elements connected to the respective bit line; and
a delay circuit connected to the control terminal of each switching transistor.

11. A semiconductor memory device according to claim 9, wherein each negative differential resistance element of the characteristic controlling circuit has substantially the same peak voltage and current as each negative differential resistance memory element, and has a current level larger than the negative differential resistance memory elements.

12. A semiconductor memory device according to claim 6, further comprising a respective voltage clamping element connected between each bit line and the ground potential wiring.

13. A semiconductor memory device according to claim 6, wherein the pair of negative differential resistance memory elements of each memory cell is a pair of resonance tunnel diodes.

14. A semiconductor memory device according to claim 6, wherein the transfer gate is a high electron mobility transistor.

15. A semiconductor memory device according to claim 13, wherein the transfer gate of each memory cell is a high electron mobility transistor and the pair of negative differential resistance memory elements of each memory cell is a pair of resonance tunnel diodes formed on one current terminal region of the high electron mobility transistor.

16. A semiconductor memory device according to claim 1, wherein the characteristic controlling circuit increases the current on a respective bit line when the memory cell corresponding to the respective bit line is selected, in relation to the current on the respective bit line when the corresponding memory cell is not selected.

17. A semiconductor memory device according to claim 1, wherein the characteristic controlling circuit increases the potential on a respective bit line when the memory cell corresponding to the respective bit line is selected, in relation to the potential on the respective bit line when the corresponding memory cell is not selected.

18. A semiconductor memory device according to claim 1, wherein the characteristic controlling circuit decreases the current on a respective bit line when the memory cell corresponding to the respective bit line is not selected, in relation to the current on the respective bit line when the corresponding memory cell is selected.

19. A semiconductor memory device according to claim 1, wherein the characteristic controlling circuit decreases the potential on a respective bit line when the memory cell corresponding to the respective bit line is not selected, in relation to the potential on the respective bit line when the corresponding memory cell is selected.

20. A semiconductor memory device according to claim 1, wherein the characteristic controlling circuit decreases the potential on a respective bit line when the memory cell corresponding to the respective bit line is selected, in relation to the potential on the respective bit line when the corresponding memory cell is not selected.

* * * * *

UNITED STATES PATENT AND TRADEMARK OFFICE
CERTIFICATE OF CORRECTION

PATENT NO. : 5,390,145
DATED : February 14, 1995
INVENTOR(S) : Nakasha et al

It is certified that error appears in the above-indentified patent and that said Letters Patent is hereby corrected as shown below:

Col. 1, line 7, after "as" insert --a--;

line 8, delete "memories" and insert --memory--.

Col. 2, line 63, delete ""b"" and insert --b--.

Col 3, line 5, delete "b" and insert --"b"--;

line 61, delete "caving" and insert --leaving--.

Col. 4, line 1, delete "d" and insert --"d"--;

line 18, delete "nonselect" and insert --non-select--;

line 37, delete "belong" and insert --being--.

Col. 5, line 1, delete "sire,pie" and insert --simple--.

Col. 6, line 67, delete "Load" and insert --load--.

Col. 11, line 9, delete "a" and insert --"a"--.

UNITED STATES PATENT AND TRADEMARK OFFICE
CERTIFICATE OF CORRECTION

PATENT NO. : 5,390,145
DATED : February 14, 1995
INVENTOR(S) : Nakasha, et. al.

It is certified that error appears in the above-indentified patent and that said Letters Patent is hereby corrected as shown below:

Col. 4, line 36, after "pair" insert -- of --.

Signed and Sealed this

Thirtieth Day of May, 1995

BRUCE LEHMAN

Attest:

*Attesting Officer*  *Commissioner of Patents and Trademarks*